United States Patent [19]

Conzelmann et al.

[11] 4,054,828

[45] Oct. 18, 1977

[54] CYCLICALLY OPERATING TRANSISTORIZED POWER SWITCHING CIRCUIT SYSTEM

[75] Inventors: Gerhard Conzelmann, Leinfelden; Karl Nagel, Gomaringen; Helmut Keller, Reutlingen, all of Germany

[73] Assignee: Robert Bosch GmbH, Stuttgart, Germany

[21] Appl. No.: 539,441

[22] Filed: Jan. 8, 1975

[30] Foreign Application Priority Data

Jan. 15, 1974  Germany ................. 2401701

[51] Int. Cl.$^2$ ............. H01L 31/00; H03K 3/26; H02H 7/06
[52] U.S. Cl. .................... 322/28; 307/303; 307/310; 323/22 T
[58] Field of Search ............ 323/22 T; 322/28; 317/100, 101 A, DIG. 6, 235; 307/254, 111, 92, 303, 315, 265, 291, 310; 331/176

[56] References Cited

U.S. PATENT DOCUMENTS

| | | | |
|---|---|---|---|
| 3,098,964 | 7/1963 | Hetzler | 322/28 |
| 3,479,534 | 11/1969 | Miller | 307/310 X |
| 3,596,115 | 7/1971 | Conzelmann | 323/22 T X |
| 3,629,623 | 12/1971 | Sakurai et al. | 323/22 T X |
| 3,654,530 | 4/1972 | Lloyd | 307/303 X |
| 3,656,028 | 4/1972 | Langdon | 307/303 X |
| 3,854,058 | 12/1974 | Nye, Jr. et al. | 307/310 X |

OTHER PUBLICATIONS

"G. E. Transistor Manual", 7th Edition, p. 200.

"Radio Shack Dictionary of Electronics" '74-'75, Ed., p. 174.

*Primary Examiner*—Robert J. Hickey
*Attorney, Agent, or Firm*—Flynn & Frishauf

[57] ABSTRACT

To provide for uniformity of power dissipation in the components of the switching system, regardless of the duty cycle upon repetitive, cyclical operation, the coupling resistors connected to the driver transistor and to the power transistor are so dimensioned relative to each other, and to the internal resistances of the driver transistor and the power transistor of the system that, in an initial approximation, the dissipation losses arising in the system are independent of the duty cycle of the switching transistor; this is obtained by selecting the sum of the resistance value of the collector resistor for the driver transistor and the base transistor of the power transistor such that (a) when the driver transistor is blocked, current flowing to the base of the power transistor holds the power transistor in full, saturated conduction and (b) the value of the collector resistor for the driver transistor is so selected that, when the driver transistor is conductive, the sum of the dissipated power in the collector-emitter path of the driver transistor, and in the collector-resistor of the driver transistor is approximately equal to the sum of the power which is dissipated in the collector resistor of the driver, the base resistor of the power transistor and the collector-emitter path of the power transistor, when the driver transistor is in blocked state. The entire system can be constructed on a monolithic chip and has a particular application as the switching circuit in automotive voltage regulators.

42 Claims, 17 Drawing Figures

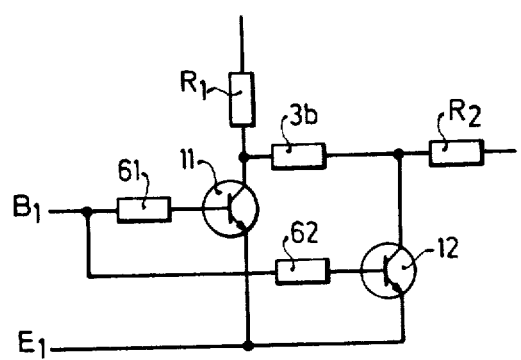
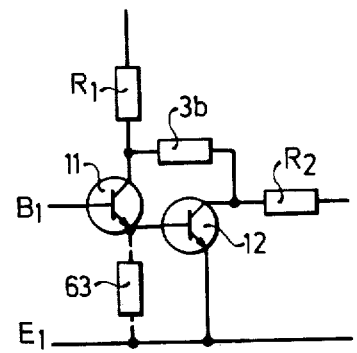
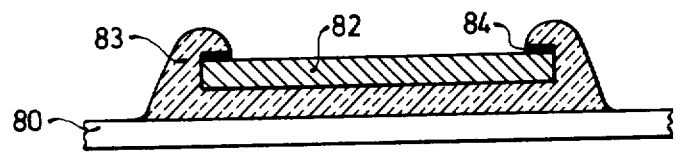
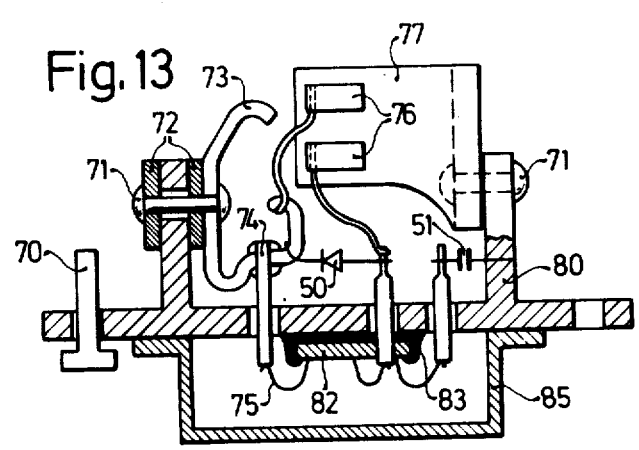

CYCLICALLY OPERATING TRANSISTORIZED POWER SWITCHING CIRCUIT SYSTEM

The present invention relates to a transistorized switching circuit system which is cyclically operating, and more particularly to such a system in which a driver transistor controls a switching power transistor, and the duty cycle, that is, the ON-OFF relationship of cyclical switching is variable.

Transistorized switching circuits have been proposed in which the collector of a power transistor is connected to the collector of a driver transistor, and the base of the power transistor is connected to the emitter of the driver transistor. This circuit, known as a Darlington circuit, has many industrial applications, for example as voltage regulator control switches connected to automotive generators, such as alternators. The control currents required are comparatively low. The minimum saturation voltage which is obtained is the sum of the base-emitter voltage of the power transistor and the collector-emitter voltage of the driver transistor. Both voltages, together, are ordinarily in the order of somewhat over 1 volt; the power transistor alone may have saturation voltages of less than 0.5 V.

Transistorized power switches connected as a Darlington circuit have a comparatively high power dissipation level. When the switch is disconnected, that is, when the power transistor is blocked or in OFF state, then the power dissipated is zero. If such a Darlington circuit is operated with variable duty cycles, which occurs, for example, when such a switch is used in the voltage regulator of an automotive alternator system, then the average power loss due to dissipation varies between a minimum value in the order of zero and a maximum value which corresponds to continuous connection. In the Darlington circuit used in automotive voltage regulators, the variation in dissipated power is between 0.6 W and 6 W. If the circuit to which the transistorized circuit is connected has temperature dependent components, then operation thereof will become dependent on the duty cycle, unless the switching circuit is thermally decoupled from the remainder of the circuit. Such thermal decoupling, however, leads to difficulties even if conventional construction of the control circuit is used, employing discrete components; a comparatively large number of additional circuit components are required. Using hybrid integrated construction adds to thermal complication difficulties and, upon monolithic integration of the entire circuit, thermal decoupling becomes almost impossible.

The term "duty cycle" used herein may be defined as the ratio of the duration of conduction, or ON condition of the switch to the duration of the blocked, or OFF condition of the switch this; is also at times referred to as the "mark-space" ratio.

It is an object of the present invention to construct a transistorized switching system which, from a thermal point of view, is independent of duty cycle.

SUBJECT MATTER OF THE PRESENT INVENTION

Briefly, the dimensions and values of the internal resistances of the components of the transistorized switch are so selected that the power dissipated — considering normal manufacturing tolerances of the components — is, in an initial approximation at least, independent of the duty cycle of the switch.

In a typical circuit, the collector-emitter path of the driver transistor is connected by means of a first resistor across a source of operating potential; the base of the power transistor is connected to the junction of the resistor with the respective electrode of the driver transistor over a second resistor. In accordance with a feature of the invention, the resistance values of the resistors are selected to meet the following conditions:

a. When the driver transistor is blocked, the sum of the resistance values of the two resistors is selected such that the current flowing to the base of the power transistor holds the power transistor, under all operating conditions, in saturated conduction; and b. the resistor connected in the emitter-collector path of the driver transistor is so dimensioned that when the driver transistor is in conductive, or ON state, the sum of the power dissipated in the first resistor and in the collector-emitter path of the driver transistor is approximately equal to the sum of the power being dissipated in the two resistors and in the power transistor when the driver transistor is blocked or in OFF state.

As can be seen, the power dissipated in the switching circuit then becomes independent of the state of the switch, as such — at least in a first approximation, considering tolerances of manufacturing components - and thermal effects become independent of duty cycle.

If the load being switched by the transistorized power switch is a pure resistive load, then the dissipation losses in the transistorized power switch become entirely independent of the duty cycle of the switch — or nearly so, considering usual manufacturing tolerances. If the connected load, however, is a reactive load, for example an inductive load which has a free-wheeling diode connected thereacross, then the dissipation losses in the transistorized power switch only become independent of the duty cycle in an initial approximation by dimensioning the resistance as above described, since the amplitude of the interrupted current depends on the mark-space ratio thereof.

In accordance with a feature of the invention, the initial approximation may be extended to a first approximation by including the power dissipated in the free-wheeling diode in the energy balance, that is, in the equality of (b) above.

The driver transistor may include a transistor which is complementary thereto. The power dissipated in the control circuit of the driver transistor then can be also included in the energy balance — equality (b) above — in such a manner that the collector resistor of the driver transistor is so dimensioned that, when the driver transistor is conductive, the sum of the power being dissipated in the first resistor and in the collector-emitter circuit of the driver transistor, including the dissipated power in the control circuit of the driver transistor, is equal, or approximately equal to the power dissipated in the two resistors and in the power transistor, when the driver transistor is blocked.

The power transistor may be constructed as a Darlington transistor; this is of particular advantage in circuits which are designed for relatively high operating voltages.

The invention will be described by way of example with reference to the accompanying drawings, wherein:

FIG. 10 is a fragmentary circuit diagram showing a cascaded driver circuit, utilizing two transistors;

FIG. 11 is a fragmentary circuit diagram of another embodiment of a cascaded driver circuit;

FIG. 12 is a schematic transverse sectional view of a chip, on which the transistor switching system is formed, mounted on a header;

FIG. 13 is a schematic part-sectional view of a voltage regulator assembled to part of the housing structure of an automotive alternator, and having a discrete free-wheeling diode;

Figure 15:
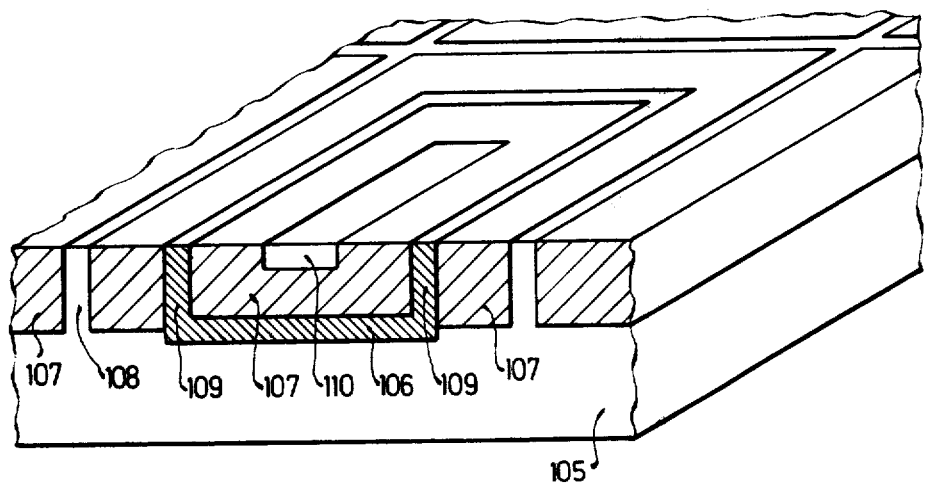
Figure 16:
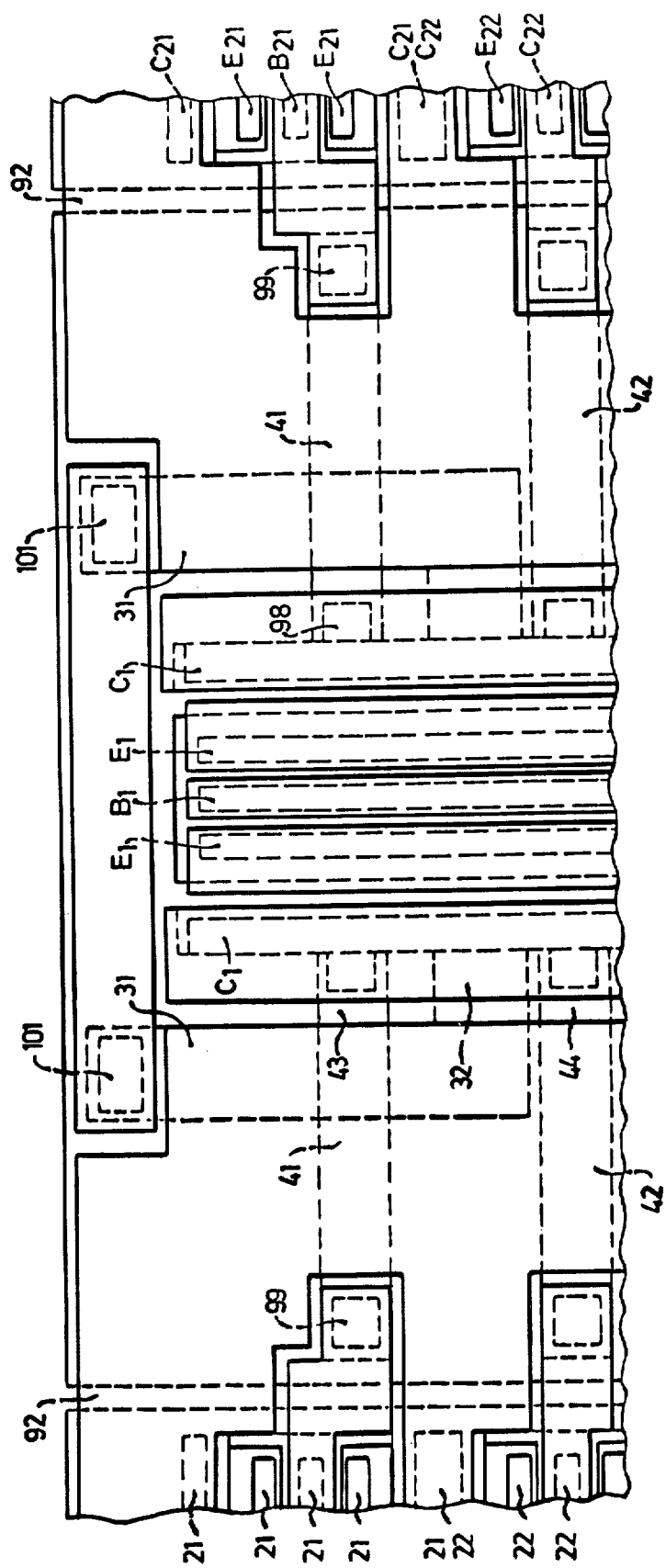
Figure 17:
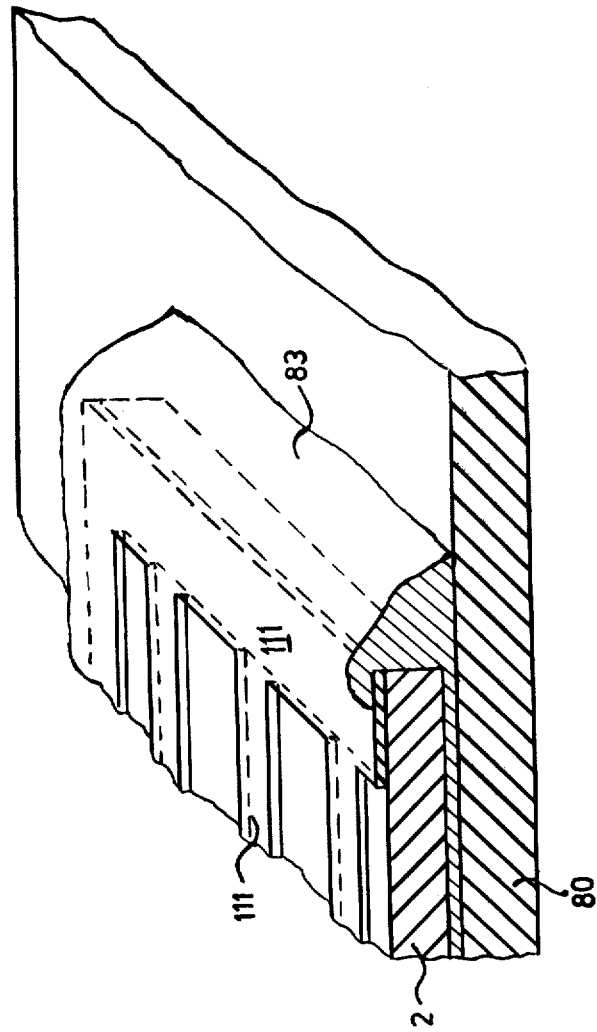

FIG. 15 is a perspective, part-sectional view of the structure of a monolithic integrated free-wheeling diode. FIG. 16 is a schematic top view of a monolithic integrated structure in which the power transistor is subdivided into cells and cell groups, symmetrically located on either side with respect to the driver transistor, with symmetrical parallel connecting resistors extending centrally from the driver transistor to the power transistor, with respect to the central axis of the driver transistor;

and FIG. 17 is a perspective, schematic view illustrating connection of a connecting strip, connecting the various transmitters of the power transistor of a cell group to the edge of the crystal chip, for adhesive connection to a base.

The invention will be described in connection with npn transistors; of course, it is equally applicable to complementary pnp transistors. For simplicity of language, the claims are likewise directed to the npn transistor structure and are deemed to include, likewise, the complementary pnp structures.

Figure 1:
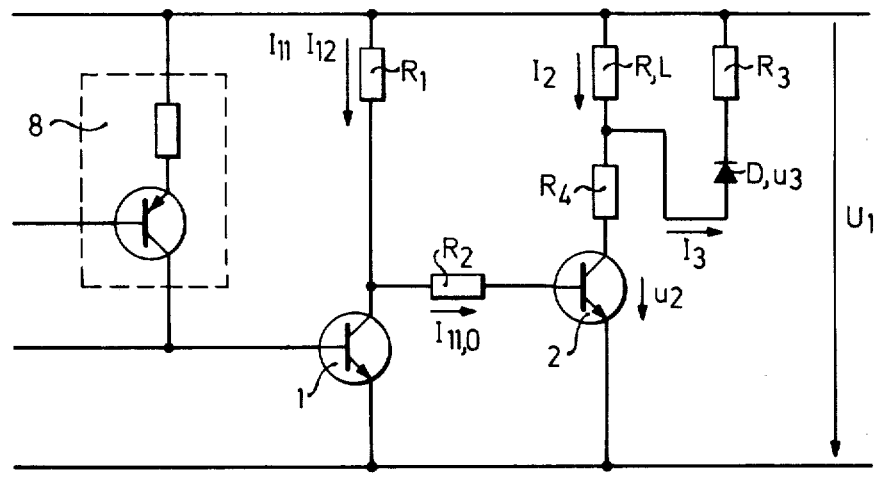
FIG. 1 is a schematic circuit diagram of a transistorized switching circuit system in accordance with the invention, showing currents and voltages arising in the circuit.

A representative circuit illustrating the concept of the present invention is shown in FIG. 1 in which a driver transistor 1 is connected to a load transistor 2. The driver transistor, shown as an npn transistor, has its collector resistor $R_1$ connected to one terminal of a power supply. The base of the switching transistor 2 is connected over coupling resistor $R_2$ to the junction between the collector of driver transistor 1 and the driver collector resistor $R_1$. The load is generally shown as R, L. The load, in any event, contains a resistive component R and may (but need not) contain a reactive component which, in the present example, is inductive. $R_4$ is the equivalent collector resistor of switching power transistor 2; $u_2$ is the inherent collector-emitter voltage of transistor 2. A free-wheeling diode D is connected in parallel to the load R, L. It has an inherent voltage $u_3$ and its inherent equivalent resistance is shown by resistor $R_3$. The current through $R_1$ and $R_2$ is shown as $I_{11}$ when the driver transistor 1 is blocked. Current $I_{12}$ is the current through resistor $R_1$ when the driver transistor 1 is conductive, or ON. $I_2$ is the collector current of the power transistor 2 when continuously conductive; $I_3$ is the current through the free-wheeling diode D. The operating voltage is shown as $U_1$.

If the load is essentially inductive, free-wheeling diode D accepts current $I_2$ as soon as the power transistor 2 is blocked or OFF. Let the duty cycle (ratio of ON to OFF duration of the power transistor) be $m$. The current $I_3$ through free-wheeling diode D is then given by relationship (1).

The average power dissipated in the control circuit $\overline{N}_{St}$ is given in relationship (2) and the power dissipated $\overline{N}_L$ is given by relationship (3).

If the load in the collector circuit of the power transistor 2 is purely resistive, that is, is a pure ohmic load, then the power dissipated is given in relationship (4).

If the free-wheeling D is disregarded, then $U_3$ and $R_3$ are to be equated to zero in relationship (3). Substituting, one obtains relationship (3a).

The parameters now are to be selected in such a manner that the sum of the power dissipated in the control loop and in the power or switching loop is as constant as possible, that is, is in accordance with relationships (5) or, even better, (5a).

The inherent voltages $u_2$ and $u_3$ of the power transistor 2 and of the diode D - if used - can be considered as independent from current $I_2$ for this consideration in an initial approximation.

The results obtained by the circuit in accordance with the present invention, in comparison to a customary Darlington circuit, are illustrated in an example in which the respective values are given in Example A, and in which the effects of the free-wheeling diode are also shown, by illustrating the example in connection with three free-wheeling diodes $D_1$, $D_2$, $D_3$ of characteristics as given in the example.

$$I_3 = I_2 \cdot m \tag{1}$$

$$\overline{N}_{St} = U_1 I_{12} - U_1 \cdot (I_{12} - I_{11}) \cdot m \tag{2}$$

$$\overline{N}_L = (R_4 - R_3) \cdot I_2^2 m^3 + [(u_2 - u_3) + R_3 I_2] \cdot I_2 \, m^2 + u_3 I_2 m \tag{3}$$

$$\overline{N}_L = R_4 I_2^2 \, m^3 + U_2 I_2 \, m^2 \tag{3a}$$

$$\overline{N}_R = (u_2 I_2 + R_4 I_2^2) \cdot m \tag{4}$$

$$\overline{N}_{St} + \overline{N}_L \approx \text{const.} \tag{5}$$

$$\overline{N}_{St} + \overline{N}_R = \text{const.} \tag{5a}$$

$$\overline{N}_{St}(m = 0) = N_L(m = 1) \tag{6}$$

EXAMPLE A

| | | | |
|---|---|---|---|
| $U_1 = 14$ V | $I_2 = 5$ A | | $I_{11} = 0.2$ A |
| $U_2 = 0.2$ V | $R_4 = 70$ mΩ | | |

| | $D_1$ | $D_2$ | $D_3$ |
|---|---|---|---|
| Diode $U_3$ | 0,8 V | 0,8 V | 0,7 V |
| Diode $R_3$ | 0,1 | 0,07 | 0,07 |

Compare Darlington:
$U_2 = 1.2$ V = const.

TABLE 1

| Circuit | Duty cycle | | | | | |
|---|---|---|---|---|---|---|
| | 0 | 0,2 | 0,4 | 0,6 | 0,8 | 1 |
| Darlington | 0 | 0,24 | 0,96 | 2,16 | 3,84 | 6 |
| Invention without diode | 5,6 | 5,1 | 4,75 | 4,7 | 4,9 | 5,55 |
| Invention with $D_1$ | 5,6 | 5,8 | 6,0 | 6,0 | 5,9 | 5,55 |
| Invention with $D_2$ | 5,6 | 5,8 | 5,9 | 5,9 | 5,8 | 5,55 |
| Invention with $D_3$ | 5,6 | 5,7 | 5,8 | 5,8 | 5,7 | 5,55 |

TABLE 2

| Circuit | maximum power dissipation difference |
|---|---|
| Darlington | 6 W |
| Invention without diode | 0,9 W |
| Invention with $D_1$ | 0,45 W |
| Invention with $D_2$ | 0,35 W |
| Invention with $D_3$ | 0,25 W |

TABLE 3

| Currents | maximum power dissipation difference |
|---|---|
| $I_{11} = 0,2\ A,\ I_{12} = 0,4\ A$ | 0,35 W |
| $I_{11} = 0,2\ A,\ I_{12} = 0,35\ A$ | 0,72 W |
| $I_{11} = 0,15\ A,\ I_{12} = 0,3\ A$ | 0,72 W |

It is usually not appropriate to permit the average overall dissipated power N to vary as little as possible about an average value, as a function of the duty cycle $m$, since the difference between the maximum and minimum power dissipation determines termperature variation. Current $I_{12}$ can readily be determined from relationships (2) and (3) by equating $\bar{N}_{Si}$ for $m = 0$ and $\bar{N}_L$ for $m = 1$, and then adding to the so obtained current the current $I_{11}$. The variation of the dissipated power as a function of the duty cycle can be minimized by suitable choice of the diode parameter; this, however, is an expensive way of proceeding. Example A, in which three diodes $D_1$, $D_2$, $D_3$ are illustrated, shows the dependence of the variation of dissipated power on diode parameters.

Table 1 shows the average dissipated power in dependence on the duty cycle $m$ for a customary Darlington circuit, and four examples in accordance with the invention, using an inductive load as shown in FIG. 1. In the first example, in accordance with the invention, the diode D has been omitted; in the last three columns, the respective diodes $D_1$, $D_2$, $D_3$ of Example A have been used. Table 2 illustrates a maximum difference in power dissipation, which may cause temperature difficulties. As seen, the variation in the Darlington circuit of 6 W is reduced by using the present invention, even without considering the characteristics of the free-wheeling diode already to 0.9 W, that is, to 15% of the previous value. Considering the free-wheeling diode, the variation in dissipated power can be reduced to between 0.25 W and 0.45 W. The table illustrates the maximum change of the average power dissipated between duty cycles of $m = 0$ and $m = 1$, for a Darlington circuit, and for circuits in accordance with the present invention, and utilizing an inductive load.

It is practically unavoidable that the various circuit components have manufacturing tolerances. The temperature differences, which may be termed the error dissipation, may increase thereby. Table 3 illustrates the error for three different pairs of currents $I_{11}$ and $I_{12}$. As can be seen, the error doubles when the resistors or, rather, the currents through the resistors vary by ± 15%. Still, the advantage over the Darlington circuit without the present invention is apparent. If the circuits are made by thick-layer, or thin-layer technology, that is, conventionally, with printed circuit boards, then it is possible to utilize components of low tolerances, that is, to at least approximately maintain design parameters. In such a case, the power dissipated in the control circuit for the driver transistor 1 can also be considered. Inclusion of the power dissipated in the control circuit for the driver 1 as an additional factor in relationships (5) and (5a) will be obvious.

Figure 2:
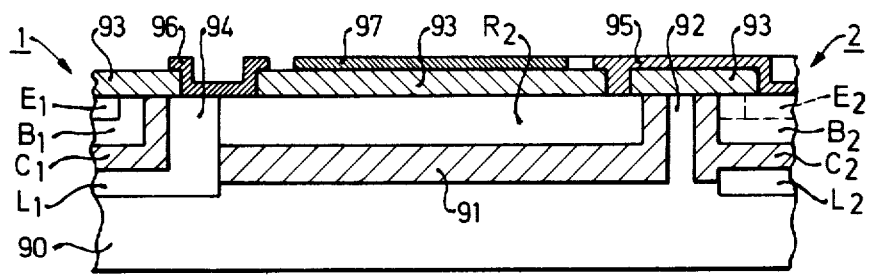
FIG. 2 is a schematic cross-sectional view through a monolithic integrated structure of a circuit in accordance with FIG. 1.
Figure 3:
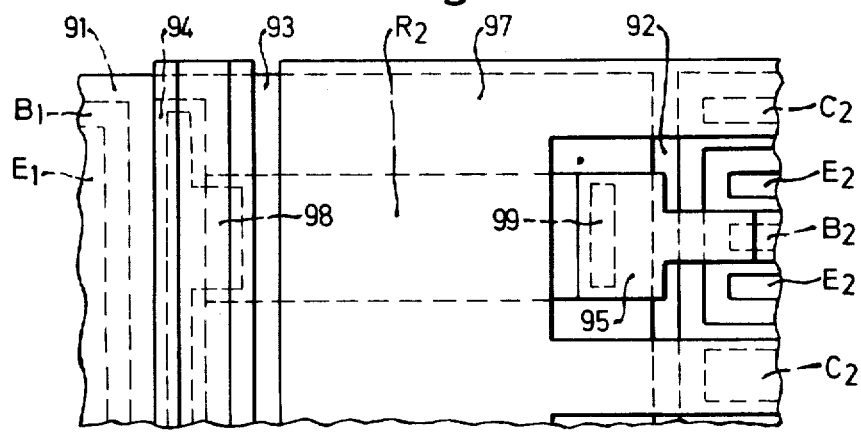
FIG. 3 is a top view of the structure of FIG. 2.

A structure, as a monolithic, integrated circuit for the transistorized switch of FIG. 1 is shown in FIGS. 2 and 3. The driver transistor 1 is at the left side and the power transistor component 2 is on the right side. The axes of the strip-shaped electrodes are located at right angles to each other which, in a multi-cellular structure of the power transistor 2 forms a particularly desirable and space-saving arrangement. An epitaxial layer 91 is applied to a substrate 90. An isolating diffusion is shown at 92, and 93 is the insulating convering layer. 94 illustrates the collector connection diffusion which, in the example shown, is a low-resistance connection formed between conductive layer $L_1$ and the connecting terminal 96 of the collector of driver transistor 1, formed of a metal such as aluminum; the connecting line 95 connects the resistor $R_2$ formed, for example by base diffusion to the base $B_2$, of the power transistor 2. The partial collectors $C_{21}$, $C_{22}$ ... $C_{2n}$ are connected to a connection line 97. The connecting windows of the resistor $R_2$ are shown at 98, 99, respectively.

Figure 4:
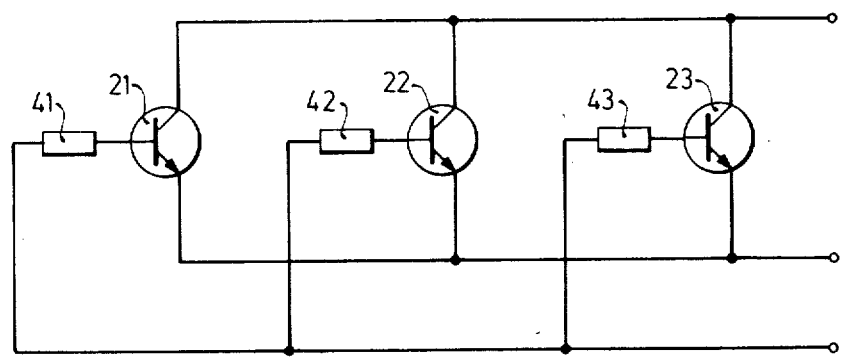
FIG. 4 is a schematic circuit of the power transistor in multi-cellular arrangement.

The power transistor 2 is split up into partial transistor elements 21, 22, 23 ... 2n, as seen in FIG. 4, which shows the multi-cellular structure. Resistor $R_2$ likewise is a multi-cellular component, split up into elements 41, 42, 43 ... 4n; each one of the partial resistance elements has a resistance value of n-times the overall resistance of resistor $R_2$. The voltage drop, individually, in the resistance elements, when using the present invention, is so great that the current distribution to the various cells remains stable, if the power transistor 2, with its partial transistors 21, 22 ... 2n is operated in the region of an emitter current density in which the current amplification decreases with increasing collector current. Equalizing and stabilization resistors for the various connections to the emitters of the transistor elements 21, 22 ... 2n are thus not necessary.

Figure 5:
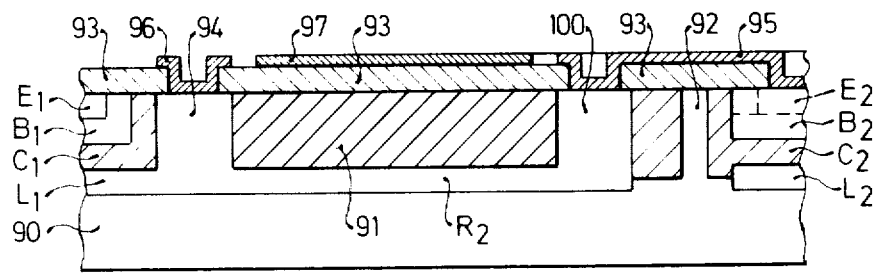
FIG. 5 is a cross section through a monolithic integrated structure of the circuit of FIG. 1, in which the second resistor is formed by conductive layer diffusion.
Figure 6:
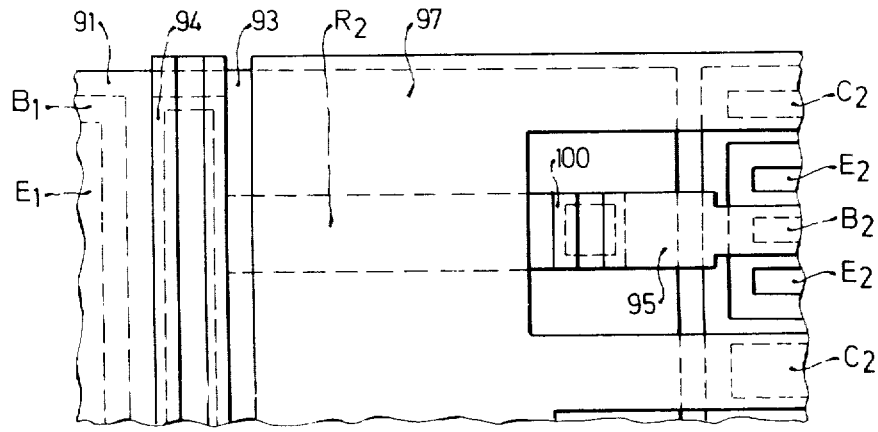
FIG. 6 is a top view of the arrangement of FIG. 5.

Embodiment of FIGS. 5 and 6: The resistor $R_2$, or the resistor elements 41, 42 ... 4n, are made by conductive layer diffusion. The terminal between the resistor $R_2$ at the base side of the power transistor and the connecting line 95 to the base B2 of the power transistor is shown at 100, which is made by means of collector contact diffusion. All other elements are similar to those described in connection with FIGS. 2 and 3 and have been given the same reference numerals and will not be described again.

Figure 7:
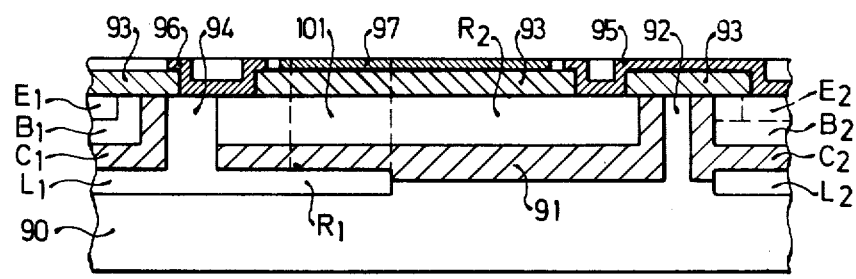
FIG. 7 is a schematic cross sectional view through a monolithic integrated structure of the circuit of FIG. 1 in which the first resistor is formed by conductive layer diffusion and the second resistor by base diffusion.
Figure 8:
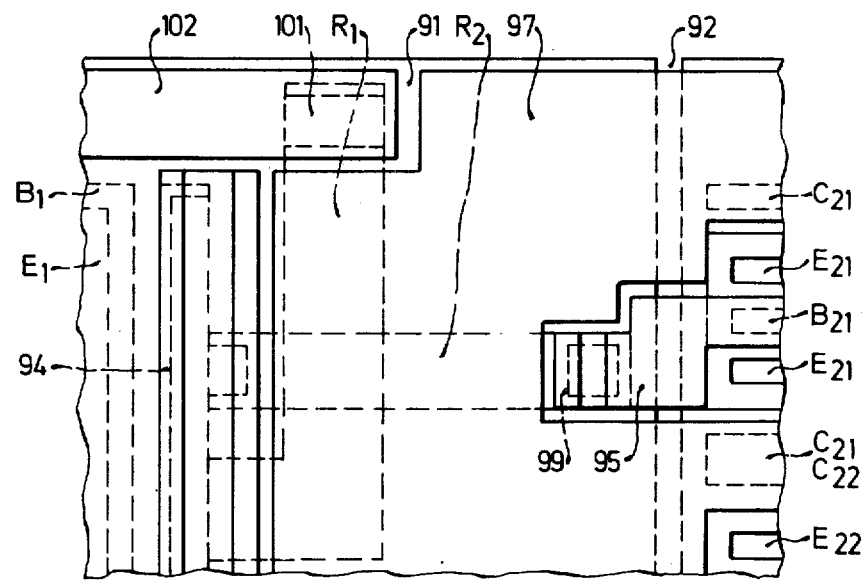
FIG. 8 is a top view of the structure of FIG. 7.

Embodiment of FIGS. 7 and 8: The resistors $R_1$ and $R_2$ are located in two superimposed planes, thus saving space. Resistor $R_1$ is made by conductive layer diffusion and resistor $R_2$ is made by base diffusion.

The resistor $R_1$ has a higher power density. In order to better utilize the surface of the crystal, resistor component $R_1$ may also be split up into two or more resistor elements. The partial resistor elements 31, 32, 33 ... 3n may be connected in series, or in parallel, or in series/parallel.

Under certain circumstances it may be desirable to form the partial resistance elements in different diffusion zones.

The multi-cellular structure of the power transistor 2 is also shown. The connection between the end of the resistor $R_1$ which connects to the power supply and the bus or line 102 to which the operating voltage is connected is formed by the element 101, made by collector connection diffusion.

Figure 9:
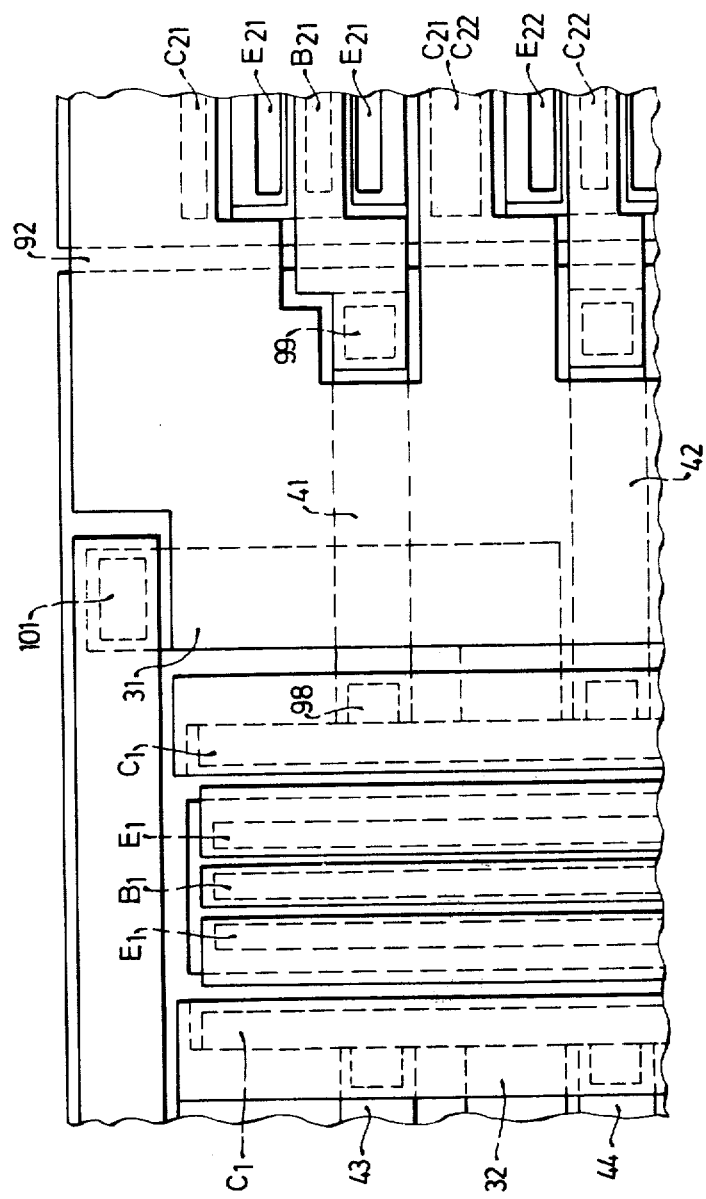
FIG. 9 is a top view of a monolithic integrated structure of the circuit of FIG. 1 in which the driver transistor is arranged transversely to the power transistor, and in which the power transistor is a multi-cellular structure.

Embodiment of FIGS. 9 and 16: This is particularly suitable for higher currents. A second multi-cellular, or multi-element group of the power transistor 2 is located, symmetrically, and as a mirror image of the first with respect to the driver transistor 1.

The power transistor 2 must be reliably blocked even if the temperature of the underlying crystal chip rises somewhat. To ensure reliable blocking of the power transistor, the driver transistor 1 must have a sufficiently low saturation voltage. This condition can be obtained, simply, by forming the driver transistor 1 in the form of a cascaded transistor array. Suitable circuits are illustrated in FIGS. 10 and 11.

Referring first to FIG. 10: The two transistors 11, 12, together, form the active components of the driver transistor circuit. The collector resistor $R_1$ of the driver transistor 1 is now split up into two partial resistance elements which have a high resistance portion 3a and a low resistance portion 3b. The resistors 61, 62 connected between the bases $B_{11}$ and $B_{12}$ are provided in order to reliably control the base currents $I_{B11}$ and $I_{B12}$.

FIG. 12 illustrates another possible circuit for a cascaded driver transistor network. Driver transistor elements 11, 12 are connected in emitter-follower circuit. Emitter E11 of transistor 11 is connected to the base B12 of transistor 12. Resistor 63 forms the base resistor for transistor 12.

A suitable mounting and holding structure for a chip on which the entire circuit can be formed is shown in FIG. 12. A large-area chip is adhered to the header by means of a conductive adhesive. In this way the connection between the header and those components which are connected to ground or chassis voltage of the integrated circuit, such as $E_1$, $E_2$ and components not shown, can be made simultaneously. Chip 82 is adhered to header 80 by conductive adhesive 83. For reliable electrical connection, the portions of the circuit at ground or chassis potential are brought out to a metallized edging 84 which, by direct contact with the conductive adhesive 83 connects the metallized connections 84 to the metal header 80.

FIG. 17 illustrates how a conductive strip 111 is brought to the edge of the chip, and the adhesive attachment thereof.

The circuit of the present invention is particularly suitable for use in voltage regulators of automotive electrical supply systems. FIG. 13 illustrates the mechanical construction of a semiconductor voltage regulator switch for an automotive alternator, in which the entire voltage regulator switch is secured to the brush holder for the slip rings of the alternator, or otherwise to the alternator housing. The header 80 (FIG. 12) simultaneously forms the support carrier for the entire assembly. Chip 82, as before, is adhered to header 80 by means of conductive adhesive 83. The chip 82 has formed thereon, in addition to the switch, the entire control circuit for the switch in accordance with the present invention. Terminals 74 for the integrated circuit are melted, vacuum-tight, into the header 80. They are connected by means of bonding wires 75 with suitable connection dots (not shown) of the chip 82. The brushes (or brush connections, respectively) for the slip ring of the alternator field are shown at 76. The brushes 76 are secured in brush holder 77 which is connected by means of a river 71 to a portion of the metallic housing or support structure 80' of the alternator forming, electrically, the equivalent of the header 80 (FIG. 12). Interposed insulating washers 72 separate a contact spring 73, secured by a river 71', to form one terminal connection of the supply voltage. Other electrical elements may be included in the electrical circuit; the free-wheeling diode D, in this construction, is formed as a discrete element 50, connected in parallel to the winding of the field. A bypass capacitor 51 is likewise provided. The chip is protected by a cover housing 85. Lead-through connections 74 are shown with exaggerated clearance from the header structure 80 although, of course, they can be melted in, to be vacuum-tight. The housing structure portion 80' is secured to the alternator structure, and hence electrically and mechanically to the chassis of the automotive vehicle by suitable connection means such as, for example, screws 70 shown schematically only and with exaggerated clearance, for clarity of illustration.

Figure 14:
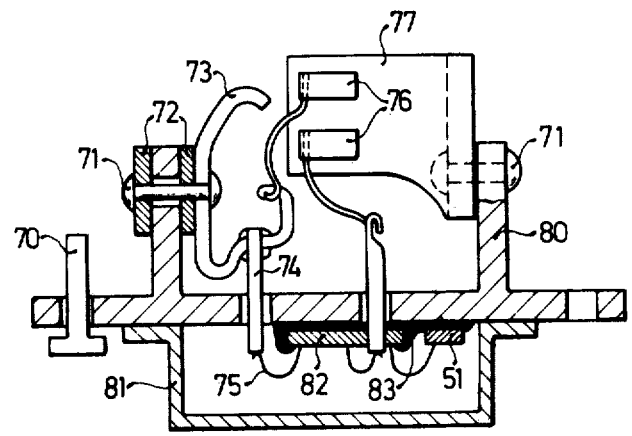
FIG. 14 is a view similar to FIG. 13, utilizing a monolithically integrated free-wheeling diode.

While the free-wheeling diode 50 may be connected as a separate discrete element, it is also possible to form the free-wheeling diode 50 on the chip as an integrated circuit. The mechanical structure is illustrated in FIG. 14 which, except for the diode 50 and the connections to the chip, is otherwise identical to the structure of FIG. 13. The diode structure itself, formed on a monolithic integrated chip, is illustrated in FIG. 15.

Substrate 105 (FIG. 15) has a conductive zone 106 buried therein, by diffusion. An epitaxial layer 107 is deposited thereover. Thereafter, isolating zone 108 is diffused into the chip. Together therewith, a deep connection 109 is diffused therein. The diffused zone 110 forms, normally, the base of the transistors. In this construction, however, it forms one of the electrodes of the free-wheeling diode D. The other electrode is formed by the epitaxial layer 107, the conductive layer 106, and the connection diffusion 109. It is important for the operation of the free-wheeling diode that the deep connection diffusion 109 surround the diode, in ring form, and is reliably connected to the buried conductive layer 106. If the diode is operated in forward direction, the electrode 110 forms the emitter. The other electrode 106, 107, and 109 forms the base, and the substrate 105 the collector of a parasitic transistor. This parasitic transistor has full operating voltage applied thereto. Large dissipated power losses would arise even at small collector currents. It is therefore important that migration of minority charge carriers from the epitaxial layer 106 into the collector space formed by the substrate 105 is inhibited. This is obtained by the highly doped connection diffusion layer 109 if this layer, as illustrated in the drawing, entirely surrounds the other electrode 110 in form of a ring, since the minority charge carriers recombine in the highly doped zones 106, 108.

The specification has been written based on the illustration of an npn transistor; the switch can be constructed, similarly, with pnp transistors. When using a monolithic integrated construction, then the structures are complementary. The voltages and currents have reversed polarity or direction, respectively.

The control circuitry for the transistorized switch may likewise be formed on the chip; control circuits for transistorized switches of semiconductor voltage regulators for automotive vehicles are well known and shown, for example, in the cross-referenced patents.

Additional references may be made to "Automotive Electronics," publication jointly under the auspices of the Automotive Electronics Committee, IEEE, and the Electrical Systems Committee, SAE, copyright SAE, 1973. Such other circuitry — for example control circuitry for the switch — is preferably located at one of the free ends of the chip, and at a position transverse to the axes of the driver transistor 1, and parallel to the axes of the power transistor 2, or to the cells, or elements thereof. Any desired circuit may be placed on the chip, and the header construction of FIG. 12 may be used to provide, simultaneously, a ground or chassis connection.

To provide for good thermal capacity, the header preferably is made of materials which have good heat conductivity, or at least is formed with a layer of such materials. The metals silver, copper, aluminum or steel are suitable; if an insulating header structure, preferably with a metallized coating is used, or with a connection to the conductive adhesive 83, then ceramics such beryllium oxide, aluminum oxide, or other insulating materials, or a combination of any of the foregoing materials are suitable. The carrier or substrate for the crystal preferably is heat-dissipating. Thus, the carrier may have an expanded surface to act as a heat sink, and heat radiator, by having its surface increased to have a profile which is, for example, U-shaped, ribbed, or the like. The attachment fins for the brush holder 77, FIGS. 13, 14, and for the power connection 73 form such an extended, heat-dissipating profile, this profile simultaneously providing attachment surfaces for electrical or mechanical elements with which the transistorized switch cooperates.

Various changes and modifications may be made and features described in connection with any one of the embodiments may be used with any of the others, within the inventive concept.

We claim:

1. Transistor power cyclical switching circuit system, particularly for variable duty cycles, having a power switching transistor component (2), a load (R,L) connected to the power switching transistor component (2), driver transistor component (1) connected to selectively control repetitive, cyclical conduction of the power transistor, and at least two coupling resistor components ($R_1$, $R_2$) connected to the driver transistor (1) and to the power transistor (2);

wherein the collector of the driver transistor (1) is connected over a first resistor component ($R_1$) with one terminal of a source of operating potential; the emitter of the driver transistor (1) and of the power transistor (2) being, each, connected to the other terminal of the source of operating voltage;

a second one of said resistance components ($R_2$) connecting the base of the power transistor (2) to the collector of the driver transistor (1);

and wherein the values of said components meet the conditions:

a. the resistance value of the first resistor component ($R_1$) is so dimensioned that, when the driver transistor is conductive, or ON, the sum of the power dissipated in said first resistor ($R_1$) and in the collector-emitter path of the driver transistor (1) is at least approximately equal to the sum of the power being dissipated in the two resistor components ($R_1$, $R_2$) and in the power transistor (2) when the driver transistor (1) is blocked, or OFF; and b. the resistance value of the second resistor component ($R_2$) is so dimensioned that, when the driver resistor (1) is blocked, or OFF, the sum of the resistance values of the two resistance components ($R_1$, $R_2$) provide a base current to the base of the power transistor (2) at a level to hold the power transistor under all possible operating conditions of the system in saturated conduction, to provide for power dissipation losses in the system which are, in an initial approximation, independent of the duty cycle of the power switching transistor (2).

2. Transistor power cyclical switching circuit system, particularly for variable duty cycles, having a power switching transistor component (2) connected to a load (R, L), a driver transistor component (1) connected to selectively control repetitive, cyclical conduction of the power transistor, and coupling resistor components ($R_1$, $R_2$) connected to the driver transistor (1) and to the power transistor (2);

wherein the values of the internal resistance of the driver transistor (1) and of the power transistor (2) as well as of the coupling resistor components are relatively selected such that the power dissipation losses arising in the coupling resistor components as well as in the transistor components due to current flow therein are, in an initial approximation, independent of the duty cycle of the power transistor (2).

3. Automotive semi-conductor voltage regulator comprising a transistor power switching circuit having a power switching transistor component (2) connected to a load (R, L), a driver transistor component (1) connected to selectively control repetitive, cyclical conduction of the power transistor, and coupling resistor components ($R_1$, $R_2$) connected to the driver transistor (1) and to the power transistor (2);

wherein the values of the internal resistance of the drive transistor (1) and of the power transistor (2) as well as of the coupling resistor components are relatively selected such that the power dissipation losses arising in the coupling resistor components as well as in the transistor components due to current flow therein are, in an initial approximation, independent of the duty cycle of the power transistor (2).

4. System according to claim 1, wherein the relative selection of the dimensions and values includes a factor allowing for manufacturing tolerances of said components.

5. System according to claim 1, wherein the load is a reactive load (R, L) and comprises a resistive component (R), a reactive component (L) and a reactive component bypass diode (D) having resistive losses;

and wherein the dissipation losses arising in the diode, upon cyclical switching of the system, are included in the energy balance equation relationship in the relative dimensions of the resistor components.

6. System according to claim 1, wherein the reactive component of the load is inductive, and the diode comprises a free-wheeling diode, the dissipation losses in the free-wheeling diode during the OFF time of the switching transistor (2) forming a factor of the equation of equality of dissipation losses in the system during the OFF time of the switching transistor (2).

7. System according to claim 1, further comprising a control circuit (8) connected to the driver transistor (1), said control circuit including a transistor complementary to the driver transistor;

and wherein the power dissipation losses included in the control circuit (8) for the driver transistor form a factor in the energy equality relationship, the collector resistor ($R_1$) of the driver transistor (1) being so relatively dimensioned that, when the driver transistor (1) is conductive, the sum of the power being dissipated in the collector resistor of the driver transistor (1) and in the collector-emitter path of the driver transistor (1) including the power being dissipated in the control circuit (8) to the driver transistor (1) is at least approximately equal, in a first approximation, to the sum of the power being dissipated in the two resistor components ($R_1$, $R_2$), and in the power transistor (2) when the driver transistor (1) is OFF.

8. System according to claim 1, wherein the power transistor (2) is a Darlington transistor.

9. System according to claim 5, in which the system is a monolithic integrated circuit, and the bypass diode (D) is a diode component formed by the base-collector path of a transistor;

said monolithic integrated circuit comprising shielding means surrounding said diode component decreasing the current amplification of the parasitic transistor formed by said diode component with the substrate to be substantially less than unity.

10. System according to claim 9, wherein the shielding means comprises a buried conductive layer in the monolithic chip, and a deep connection diffusion zone, forming an ohmic connection to said buried layer.

11. System according to claim 1, wherein said system comprises a monolithic integrated circuit, and wherein the resistor component ($R_2$) connected between the collector of the driver transistor (1) and the base of the power transistor (2) comprises a bridge extending from the collector of the driver transistor (1) to the base of the power transistor (2), and an insulating covering layer placed above said resistor component ($R_2$), said insulating covering layer being metallized, the metallization of said covering layer forming contact connections to at least one of the collector, and emitter electrodes of the power transistor (2).

12. System according to claim 1, wherein the system is formed as a monolithic integrated circuit, and wherein the power transistor (2) comprises a plurality of cells or elements.

13. System according to claim 12, wherein the resistor component ($R_2$) connected to the base of the power transistor (2) comprises a plurality of resistor elements (41, 42 . . . 4n), each connected to a respective base of the respective cells, or elements of the power transistor (2), the total resistance value of said resistor elements (41, 42 . . . 4n), connected in parallel having the value of said resistor component ($R_2$).

14. System according to claim 1, wherein one of the resistor components ($R_2$) connects the base of the power transistor (2) and the collector of the driver transistor (1), and said system is a monolithic integrated circuit; wherein said resistor component is formed by base diffusion in the chip.

15. System according to claim 1, wherein one of the resistor components ($R_2$) connects the base of the power transistor (2) and the collector of the driver transistor (1), and said system is a monolithic integrated circuit; and wherein the resistor component is formed by a conductive layer diffusion zone.

16. System according to claim 1, wherein one of the resistor components ($R_2$) connects the base of the power transistor (2) and the collector of the driver transistor (1), and said system is a monolithic integrated circuit; wherein a separate resistor trough is provided in the chip for said resistor component ($R_2$).

17. System according to claim 4, wherein the system is constructed on a monolithic integrated chip, and wherein at least one of the resistor components ($R_1$, $R_2$) is formed in a common zone, or trough, with the driver transistor (1).

18. System according to claim 17, wherein the collector resistor ($R_1$) comprises at least one resistor element (31, 32 . . . 3n) and is located in the same diffusion zone or trough as the driver transistor (1).

19. System according to claim 17, wherein the base transistor ($R_2$) comprises at least one resistor element (41, 42 . . . 4n) and said element is located in the same diffusion zone, or trough, as the driver transistor (1).

20. System according to claim 17, wherein both the collector resistor ($R_1$) and the base transistor ($R_2$) for the power transistor (2) comprise at least one resistor element (31, 32 . . . 3n; 41, 42 . . . 4n) and the elements of both said resistors are located in a common diffusion zone, or trough, with the driver transistor (1) in the chip.

21. System according to claim 1, wherein one of the resistor components ($R_2$) connects the base of the power transistor (2) and the collector of the driver transistor (1), and said system is a monolithic integrated circuit;

and wherein said resistor component ($R_2$) comprises at least one resistor element (41, 42 . . . 4n), said at least one element being formed by base diffusion.

22. System according to claim 21, wherein the collector resistor ($R_1$) of the driver transistor (1) comprises at least one resistor element (31, 32 . . . 3n), said at least one collector element being formed by conductive layer diffusion;

and said at least one resistor elements of said resistor components ($R_1$, $R_2$; 31, 32 . . . 3n; 41, 42 . . . 4n) are formed in the chip in a common trough, or zone, and located at least in part in superposed strata in the chip.

23. System according to claim 22, wherein the terminal of the at least one element of the collector resistor ($R_1$; 31, 32 . . . 3n) connecting to the collector of the driver transistor (1) is directly connected to the driver transistor terminal connection.

24. System according to claim 23, wherein the chip is formed with an isolating diffusion layer separating the collector trough, or zone of the driver transistor (1) from the trough, or zone, containing the resistance component elements;

said resistor trough or zone including at least one of the resistor components, or their respective elements ($R_1$, $R_2$; 31, 32 . . . 3n; 41, 42 . . . 4n);

said isolating diffusion layer being interrupted at the terminal end of the respective resistor component, or element, adjacent the collector connection conductive zone of the collector, to form an electrical connection therewith.

25. System according to claim 1, in which the system is in the form of a monolithic structure located on a semiconductor material clip, and wherein the axis of the driver transistor (1) is formed by a parallel arrangement of emitter-base-collector connecting strips, said connecting strips extending in a direction perpendicular to the axis of the power transistor (2).

26. System according to claim 25, wherein at least one of the resistor components ($R_1$, $R_2$) is located on the chip intermediate the driver transistor (1) and the power transistor (2).

27. System according to claim 26, wherein the power transistor (2) is sub-divided into a plurality of cells, said cells being grouped in at least two groups:

and wherein at least one of said transistor components ($R_1$, $R_2$) is sub-divided into resistor elements (31, 32 ... 3n; 41, 42 ... 4n), the resistor elements being located with respect to the groups of cells or elements of the power transistors symmetrically with respect to the central axis of the driver transistor (1).

28. System according to claim 1, wherein the system is formed as an integrated circuit on a semiconductor chip, and wherein at least one of the transistors is formed as a plurality of transistors elements having emitter connections, and wherein the connecting paths of the respective emitter connections of the power transistor elements extend along at least one of the edges of the semiconductor crystal.

29. Circuit structure comprising the system of claim 1, said structure including a semiconductor chip, a substrate, and an electrically conductive adhesive securing the chip to the substrate;

said substrate being connected to the emitter voltage of the semiconductor chip, the electrically conductive adhesive forming a contact connection between the edge of the crystal chip and the emitter connection of the power transistor, the emitter connection extending along the edge of the crystal surface and being electrically connected by means of the electrically conductive adhesive.

30. Structure according to claim 29, wherein the substrate includes material which has good heat conductivity and comprises at least one material selected from the group consisting of: silver, copper, aluminum, steel, beryllium oxide, aluminum oxide, other heat-conductive ceramics, and combinations of at least two of the foregoing.

31. System according to claim 1, wherein the driver transistor component (1) comprises two partial transistor elements (11, 12), the emitters of said elements being connected together directly, and the bases being connected directly, the collectors of which are connected by a resistor component (3b) (FIG. 10).

32. System according to claim 22, wherein the driver transistor component (1) comprises at least two partial transistor elements (11, 12), the emitters of which are connected directly together;

partial resistor elements (61, 62) being provided, connecting the bases together;

and a resistor (3b) connecting the collectors of the transistor elements (FIG. 10).

33. System according to claim 1, wherein the driver transistor component (1) comprises two partial transistor elements (11, 12);

a resistor (3b) connecting the collectors of the driver transistor elements together;

and means connecting the emitter (E11) of the first partial transistor (11) with the base (B12) of the second partial transistor (12) (FIG. 11).

34. System according to claim 1, wherein the resistor component having the highest power dissipation density is subdivided into at least two partial resistor elements, the resistances of the partial resistor elements, connected together, forming the resistance of said resistor component.

35. System according to claim 1, wherein the power transistor (2) comprises a plurality of transistor elements;

and wherein each element of the transistor is operated in a current density region in which, at maximum operating current, the current amplification decreases with increasing collector current.

36. System according to claim 34, wherein the resistor elements are formed by diffusion zones which are different for different resistor elements.

37. Circuit structure comprising the system of claim 1, and a semiconductor chip, on which said system is formed, in combination with a circuit connected to said system, wherein said circuit is formed at least in part on the chip including said system.

38. Structure according to claim 37, wherein said circuit is located on the chip adjacent a free end thereof, and disposed transversely to the axis of the driver transistor (1) and parallel to the axis of the power transistor (2).

39. Substrate carrier for a semiconductor chip, said semiconductor chip having formed thereon the system according to claim 1;

said carrier having a heat-dissipating surface including heat-dissipating ribs increasing the radiation surface area thereof.

40. Structure according to claim 39, including additional components electrically or mechanically connected to said chip, said additional components being located on said carrier.

41. Automotive semiconductor voltage regulator comprising the system of claim 6, wherein said inductive load comprises the field of an automotive alternator.

42. Automotive semi-conductor voltage regulator comprising the system of claim 1.

* * * * *